United States Patent [19]

Bauer et al.

[11] Patent Number: 5,444,656
[45] Date of Patent: Aug. 22, 1995

[54] APPARATUS FOR FAST INTERNAL REFERENCE CELL TRIMMING

[75] Inventors: Mark Bauer, Cameron Park; Johnny Javanifard, Sacramento, both of Calif.

[73] Assignee: Intel Corporation, Santa Clara, Calif.

[21] Appl. No.: 252,908

[22] Filed: Jun. 2, 1994

[51] Int. Cl.⁶ .............................................. G11C 11/40
[52] U.S. Cl. ........................ 365/189.01; 365/185; 365/900; 365/210; 365/189.07; 365/189.09
[58] Field of Search ................... 365/189.01, 185, 900, 365/189.07, 210, 207, 189.09, 182

[56] References Cited

U.S. PATENT DOCUMENTS

| | | | |
|---|---|---|---|
| 5,293,345 | 3/1994 | Iwahashi | 365/210 |
| 5,293,560 | 3/1994 | Harari | 365/185 |
| 5,351,212 | 9/1994 | Hashimoto | 365/185 X |
| 5,355,333 | 10/1994 | Pascucci | 365/210 X |
| 5,395,362 | 2/1995 | Banks | 365/185 X |

FOREIGN PATENT DOCUMENTS

0390404 10/1990 European Pat. Off. ............ 365/185

Primary Examiner—David C. Nelms
Assistant Examiner—Huan Hoang
Attorney, Agent, or Firm—Blakely, Sokoloff, Taylor & Zafman

[57] ABSTRACT

A memory array having memory devices arranged in rows and columns, each column including a load device across which a first voltage level is provided when a memory device being read is in one condition and a second voltage level is provided when a memory device being read is in a second condition, a reference device arranged in series with another load device, a sensing device for detecting the voltages across the load devices and providing a first output signal when the voltage across the first load device is greater than the voltage across the second voltage device and a second output when the voltage across the first load device is less than the voltage across the second voltage device. The array also includes an arrangement for decoupling the memory devices and the associated load devices and applying a precise voltage equivalent to the one of the voltages across the load device while programming the reference devices so that the voltage across the second load device is compared to this precise voltage when the reference device is being programmed.

19 Claims, 5 Drawing Sheets

APPARATUS FOR FAST INTERNAL REFERENCE CELL TRIMMING

BACKGROUND OF THE INVENTION

1. Field Of The Invention

This invention relates to computer systems, and more particularly, to methods and apparatus for rapidly and accurately trimming the values stored by reference cells used for reading flash EEPROM memory.

2. History Of The Prior Art

Recently, flash electrically-erasable programmable read only memory (flash EEPROM memory) has been used as a new form of long term storage. A flash EEPROM memory array is constructed of floating gate field effect transistor devices. Such memory transistors may be placed in a programmed state by storing a charge on the floating gate. The condition (programmed or erased) may be detected by interrogating the cells. An example of a flash EEPROM memory array which may be used in place of a hard disk drive is given in U.S. patent application Ser. No. 07/969,131, entitled *A Method and Circuitry For A Solid State Memory Disk*, S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is extremely important.

Recently, it has been discovered that the transistor devices used for flash EEPROM memory arrays may be made to store more than two conditions. Essentially, four or more distinct levels of charge may be stored on the floating gate of the devices by varying the voltages applied to the terminals of the devices; and these different levels may be detected. This allows flash EEPROM devices in memory arrays to store more than one bit per device and radically increases the storage capacity of such arrays.

Flash EEPROM arrays, like other transistor memory arrays utilize reference devices to store values against which the memory cells are tested to determine their condition when the memory cells are read. These reference devices are typically flash EEPROM device similar to those used for storing data in the array. In a typical memory array in which two possible conditions are available for each memory cell, the reference devices are programmed into a condition to produce a particular current value when interrogated which is midway between the two conditions of the memory cells. The current through the reference device in turn produces a voltage which is measured against a voltage produced by current through a memory cell. The condition of the reference device need not be programmed especially accurately because there is a large margin for error between the two states of the memory cells which the reference device is used to measure. Consequently, this condition has normally been programmed using gate and drain voltages unrelated to operation of the array to obtain a desired current value through the reference device. Typically, this programming has been a relatively slow process due to the need to program and test repeatedly until a correct current is realized. Moreover, since the threshold voltage has been found to have a one-to-one ratio to the gate voltage used in programming, the gate voltage used to program this current through the reference device is then used to provide the current through the reference device during a read of the memory cells.

With the new storage arrangements in which more than one bit may be stored by each memory transistor, many more reference cells are utilized since many more levels must be tested to determine a value stored by the floating gate of a memory cell. Since a number of voltage levels must be measured, the values stored by the reference cells need to be very accurately determined.

SUMMARY OF THE INVENTION

It is, therefore, an object of the present invention to provide an improved method and apparatus for placing reference cells used in flash EPROM memory arrays in a proper condition.

It is another more specific object of the present invention to provide a more rapid method for placing reference cells used in flash EPROM memory arrays in a proper condition.

These and other objects of the present invention are realized in a memory array having memory devices arranged in rows and columns, each column of memory devices including a first load device across which a first voltage level is provided when a memory device being read is in one condition and a second voltage level when a memory device being read is in a second condition, a reference device arranged in series with a second load device, a sensing device for detecting the voltages across the first and second load devices and providing a first output signal when the voltage across the first load device is greater than the voltage across the second load device and a second output when the voltage across the first load device is less than the voltage across the second load device. The array also includes an arrangement for decoupling the memory devices and the associated load devices and applying a precise voltage equivalent to the one of the voltages across the load device while programming the reference devices so that the voltage across the second load device is compared to this precise voltage when the reference device is being programmed.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
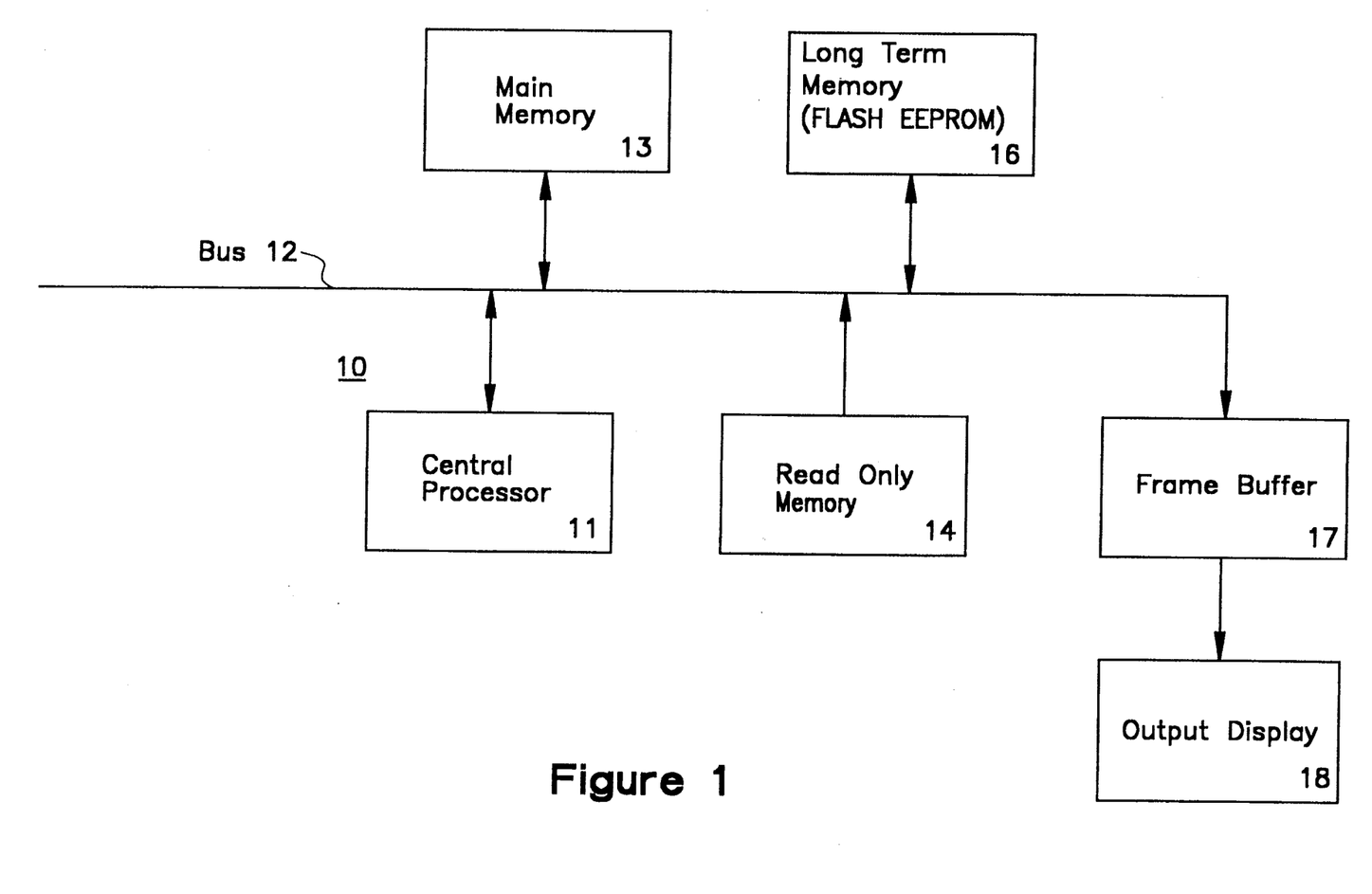
FIG. 1 is a block diagram of a computer system which may include the present invention.

Referring now to FIG. 1, there is illustrated a computer system 10. The system 10 includes a central processing unit 11 which executes the various instructions provided to control the operations of the computer system 10. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such read only memory 14 may be constructed of flash EEPROM memory cells adapted to be modified as various ones of the BIOS processes used by a particular computer system are changed.

Also connected to the bus 12 are various peripheral components such as long term memory 16 and circuitry such as a frame buffer 17 to which data may be written which is to be transferred to an output device such as a monitor 18 for display. Rather than the electromechanical hard disk drive which is typically used for long term memory, a flash EEPROM memory array may be used as the long term memory 16. Such flash EEPROM memory arrays typically includes circuitry for controlling the operation of the memory array including all of the operations associated with programming and erasing the memory and reference cells of the memory array. Such a flash EEPROM memory array is described in detail in the copending patent application mentioned above.

Figure 2:
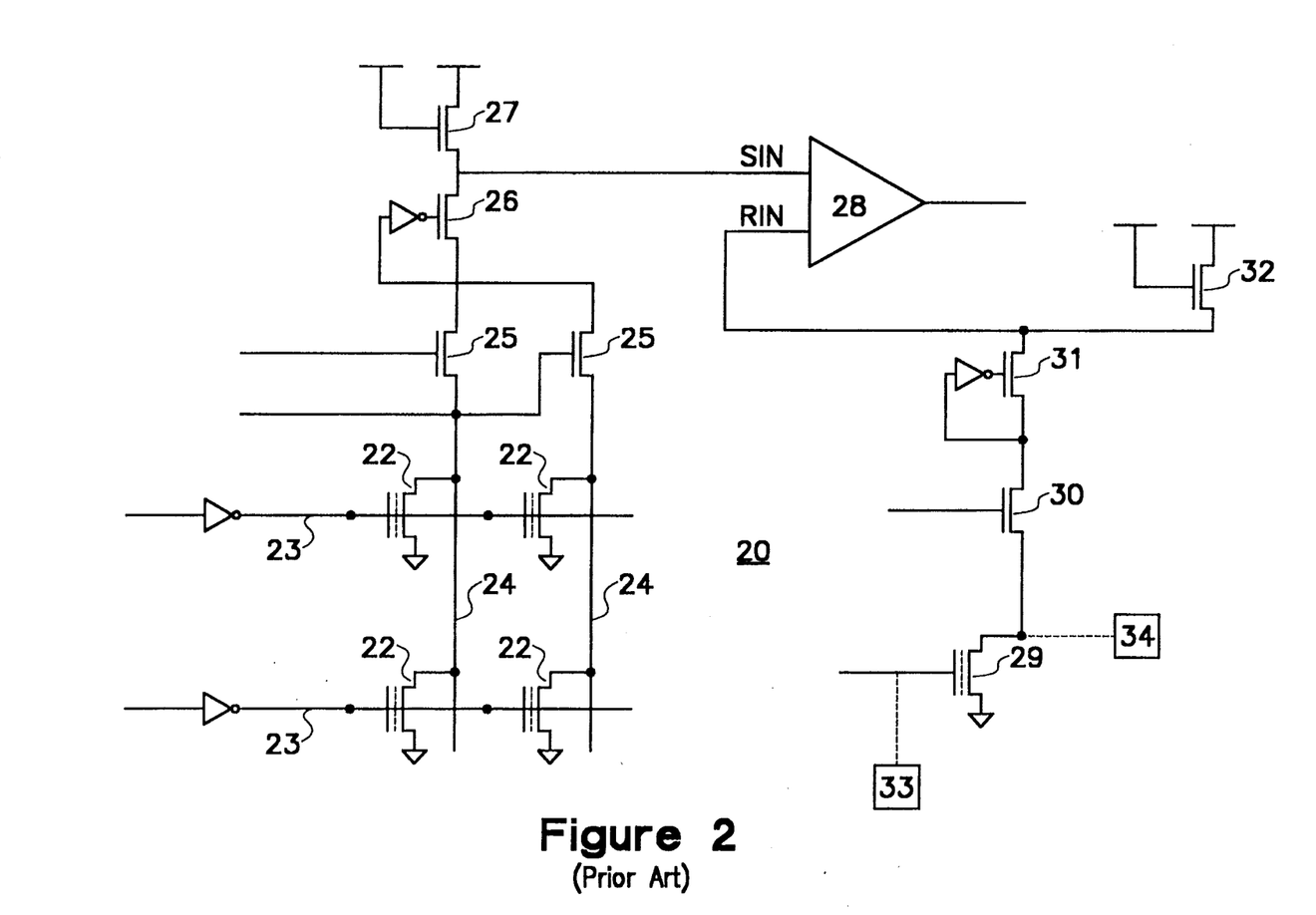
FIG. 2 is a circuit diagram of a portion of a prior art flash EEPROM memory array.
Figure 3:
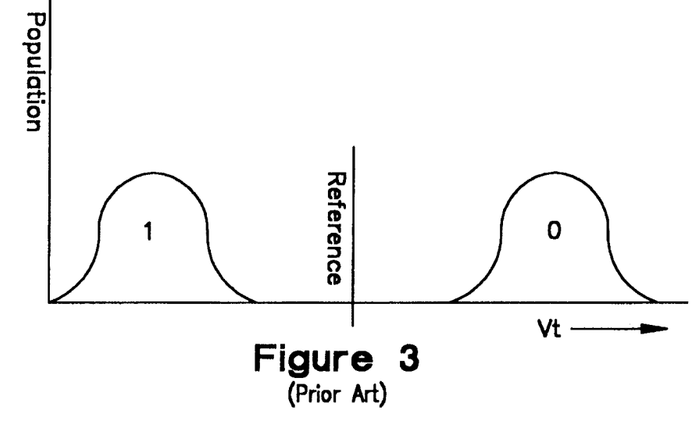
FIG. 3 is a diagram illustrating voltage/current conditions of flash EEPROM memory transistors in the array of FIG. 2.

A flash EEPROM memory array is constructed of floating gate field effect transistor devices. Such memory transistors may be programmed to change the charge stored on the floating gate, and the condition (programmed or erased) may be detected by interrogating the cells. FIG. 2 illustrates a portion of a typical flash EEPROM memory array constructed in accordance with the teaching of the prior art. As may be seen in FIG. 2, the array 20 includes a plurality of floating gate field effect transistor devices 22 arranged in rows and columns. Although not shown in detail, circuitry is provided for addressing any particular device 22 by selecting a particular row and column. Typically, a N type device 22 is erased (placed in a one condition) by applying a value such as twelve volts to the source terminal while grounding the gate terminal and floating the drain terminal. When a device is erased, any charge on the floating gate is tunneled from the floating gate. A device 22 is selectively placed in the zero or programmed condition by placing approximately twelve volts on the gate terminal, approximately seven volts on the drain terminal, and ground on the source terminal. A device which is programmed has a substantial charge placed on its floating gate. The condition of a device 22 is read by detecting the charge on the floating gate. This is accomplished by placing approximately five volts on the gate terminal, a bias voltage through a cascode device and feedback on the drain terminal, and grounding the source terminal. As is shown in FIG. 3 which illustrates the population of devices 22 having particular threshold voltages in the erased and programmed conditions, when a device 22 is functioning within tolerances, the gate-source voltage is greater than the threshold voltage Vt of the erased cells and is less than the threshold voltage Vt of the programmed cells. Thus, a device 22 which has been programmed with a substantial charge on the floating gate conducts less current while a device which has been erased will transfer a substantially greater amount of current.

In order to determine the charges which are stored by the floating gates of each of the memory transistors in a flash EEPROM array, reference devices are utilized. These reference devices are floating gate field effect transistor devices essentially identical to the memory transistors. The reference devices are programmed to precise values by placing charges on the floating gates. When the memory cells are read, the value of the charge stored by each memory transistor is tested against the value of the charge stored by the reference cells to determine the condition (state) of the memory cell. In a typical flash EEPROM memory array in which only two possible conditions are available for each memory cell, the reference devices are programmed to states midway between the programmed and erased states of the memory cells to produce a particular value when interrogated. This state need not be determined especially accurately (although it should be sufficiently accurate to produce a reference voltage typically within 70 millivolts of the threshold voltage Vt) because there is a large range between the two states of the memory cells and thus a large margin for error. Consequently, this condition has normally been programmed in a separate reference cell programming mode by placing programming voltages on the terminals of the reference devices and programing to obtain a desired current value through the devices. This desired current level is reached by raising the gate voltage to an appropriate level until the desired current is attained and read by testing circuitry. This gate voltage then is selected to provide the desired reference condition during operation. In prior art arrangements, the programing of the reference cell occurs in a programming mode while the measurement of current through the reference cell occurs in a testing mode. Programming a reference cell to a proper level requires switching between programming and testing modes until the proper current is obtained. Typically, this has been a relatively slow process because it requires repeated programming and testing until a correct current is reached.

In FIG. 2, the typical arrangement of memory transistors 22 for reading memory cells in prior art arrangements is illustrated. As may be seen, each memory transistor 22 has its gate terminal joined to a wordline 23, its source terminal connected to ground, and its drain terminal connected to a bitline 24. A N type FET transistor device 25 is arranged as a column select device to allow any particular column to be selected. The drain terminals of the devices 25 are joined through a N type device 26 connected in a cascode arrangement to provide drain bias for the devices 22. The source terminal of the device 26 is connected to a N type device 27 (which may be a device having a low threshold voltage Vt) joined to Vcc. When five volts is applied to the gate terminal of a particular device 22 in a selected column, that device 22 transfers current if five volts is greater than the threshold voltage Vt produced by the charge stored on its floating gate and does not transfer a current if five volts is less than the threshold voltage Vt. If the device 22 transfers current, this current causes voltage drops across the device 26 and the device 27. The voltage at the drain terminal of the device 26 is furnished to one input of a sense amplifier 28. The sense amplifier 28 receives at its other input a voltage generated in response to a current through a reference transistor 29 arranged in a similar current path with devices 30, 31, and 32 which are chosen to be identical to the devices 25, 26, and 27. If the current through the device 22 being read is greater than the current through the reference device 29, the sense amplifier 28 produces one output signal. If the current through the device 22 being read is less than the current through the reference device 29, the sense amplifier 28 produces a different output signal.

In prior art arrangements such as that illustrated in FIG. 2, the levels to which the memory transistors 22 are programmed are typically quite widely separated as is illustrated in FIG. 3. Because of this, the reference cell programming need not produce too accurate a value. Heretofore, the reference devices 29 have been programmed to provide a reference value by applying a first voltage level Vpx to the gate terminal and a second programming voltage level to the drain terminal through programming circuitry external to the circuit 20 illustrated (represented by pads 33 and 34) and raising the value of Vpx until a particular level of current (e.g., 10 microamperes) is obtained when the reference cell is read.

On the other hand, the memory devices 22 are programmed in an entirely different manner than are the reference devices 29. The devices 22 are programmed by applying programming voltages to change the charge stored on the floating gate so that when the condition of a device 22 is read the voltage level at the input to the sense amplifier 28 produced by the current through the device 22 is just sufficient to switch the amplifier 28 to the other state.

With the new storage arrangements in which more than one bit may be stored by each memory transistor 22, many more reference cells are utilized since many more levels must be tested to determine a value stored by the floating gate of a memory cell. Since a number of levels must be measured and the levels of charge between levels are relatively narrow, the values stored by the reference cells need to be very accurately determined in the new arrangements.

The arrangement provided by the prior art for programming reference cells does not provide the accuracy necessary to determine the different levels of charge which may be stored by the memory transistors. More particularly, the programming of the reference devices is accomplished by voltages applied to the terminals of the reference transistors and varied to obtain a measured current value in an operation unrelated to the circuitry utilized in reading the memory cells. On the other hand, the memory devices are programmed to a correct level and the programming verified by measuring the voltage level caused by the current due to the charge on the memory transistor at one input to the sense amplifier against the voltage level produced by current through the reference cell at the other input to the sense amplifier.

Because the methods of verifying the results of the programming of memory and reference devices differ, the programming of the reference devices is not verified with sufficient accuracy that changes in process, temperature, and the like will not affect the levels at which the sense amplifiers read of the memory cells. For example, since the voltage drop across the devices 27 and 32 is determined as a square root of the current through the devices, the accuracy of the measurement by the sense amplifier 28 will be radically affected by changes in process, temperature, or other characteristic which affect any portion of the circuit which varies the currents through these devices. Since the current through the reference cells ultimately controls the current through these devices, the manner of trimming the reference cell values without relation to other elements in the circuit is just not sufficiently accurate for multiple bit memory cells.

Figure 4:
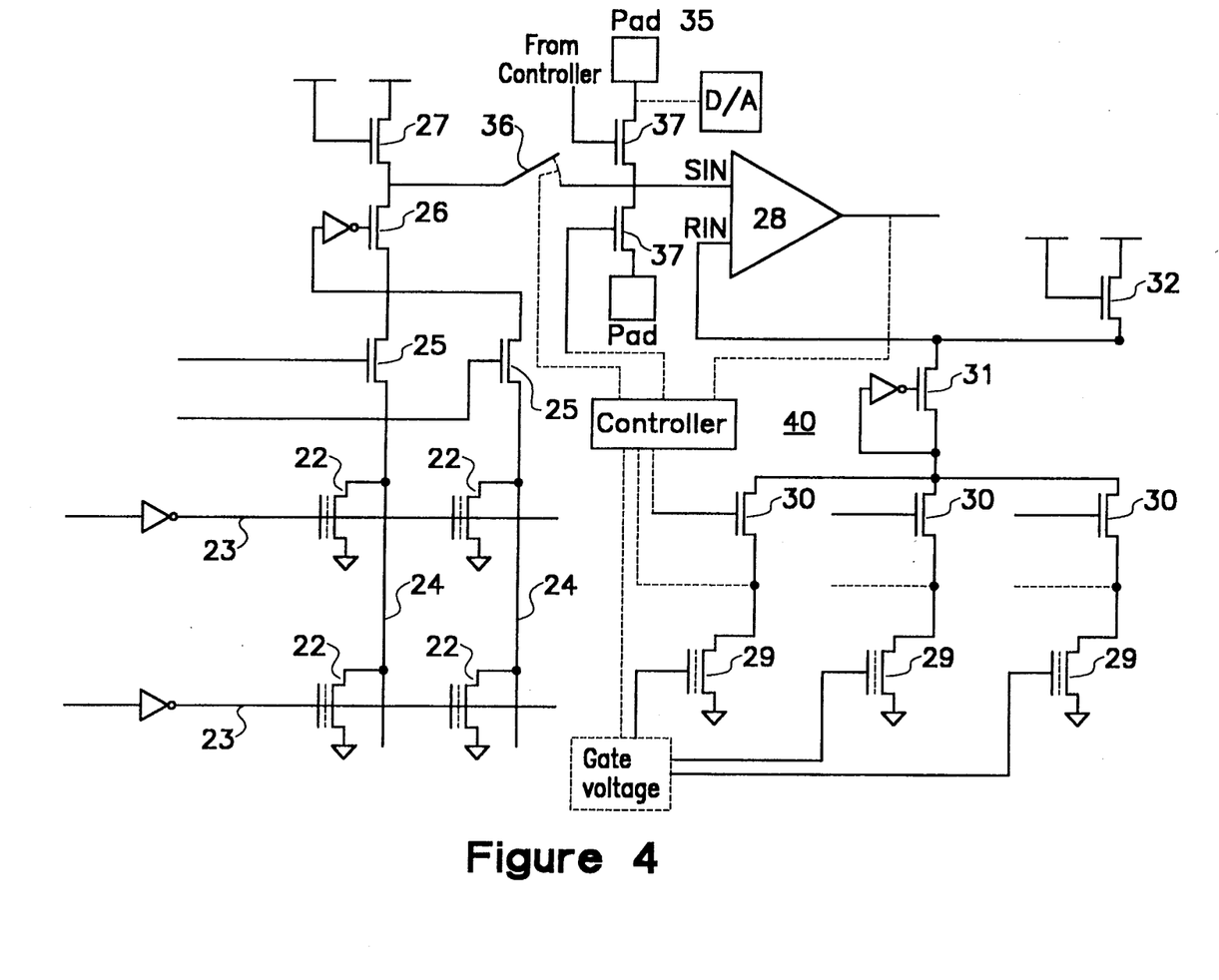
FIG. 4 is a more detailed block diagram of a memory array in accordance with the present invention.
Figure 5:
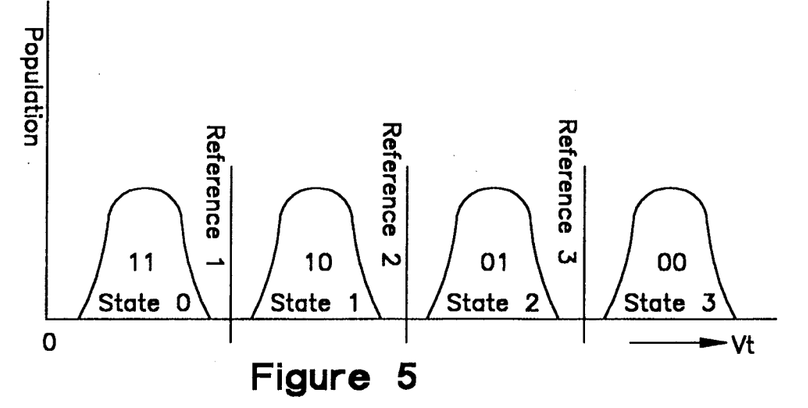
FIG. 5 is a diagram illustrating voltage/current conditions of flash EEPROM memory transistors in the array of FIG. 4.

FIG. 4 illustrates an arrangement in accordance with the present invention for verifying the charges stored on floating gates of the reference cells so that a plurality of bits may be stored by a flash EEPROM memory transistor. This same arrangement may be utilized to more accurately verify the trimming of reference cells used in other types of memory arrays or for other purposes where accuracy is especially important.

As may be seen, the circuit 40 of FIG. 4 includes many of the same elements as the circuit of FIG. 2. Memory devices 22 have their gate terminals joined to wordlines 23 and their drain terminals connected to bitlines 24. A selection transistor 25 selects the cells 22 of a particular column for connection through a cascode device 26 to a column load device 27. The voltage level between the device 27 and the device 26 is furnished to sense amplifier 28 during a read operation. A plurality of reference devices 29 are connected so that each may be joined through a selection device 30 and a cascode device 31 to a reference column load device 32. The voltage level at the node between the device 32 and the device 31 is furnished to the sense amplifier 28 during a read operation.

As may be seen, a number of different reference devices 29 may be provided with their floating gates programmed to different levels to allow the value of the charge stored on any device 22 to be tested against different reference levels. Each of these reference devices 29 is connected in the same manner. By enabling a particular device 30, the desired one of the reference devices 29 may be connected so that the voltage produced by the current through it may be used at the RIN terminal of the sense amplifier 28.

In order to allow the reference devices to be very accurately trimmed and verified, a precise voltage level is provided at the SIN terminal of the sense amplifier 28. This voltage value may be furnished from a direct connection from testing circuitry at an external pad such as the pad 35 illustrated. In some embodiments of the circuitry with which the present invention is utilized, a digital-to-analog converter circuit is provided as a part of the circuitry of the integrated circuit of which the memory array is a portion. Such a circuit may also be utilized to furnish an accurate voltage through a connection to the SIN terminal. Each of these arrangement may provide a plurality of precise voltages for trimming the different reference devices used with a multi-level flash EEPROM cell.

In order to provide a correct voltage value at the SIN terminal so that the internal elements of the circuitry affecting the value of the voltage at the RIN terminal of the sense amplifier 28 are all considered during trimming of the reference devices 29, a means such as a switch 36 (preferably a transistor switch) is provided for disconnecting the array from the sense amplifier during setup. In this manner the array will have no affect on the trimming of the reference devices 29. Alternatively, the array might be disabled or disconnected in some other manner during the period in which the reference values are established.

Figure 6:
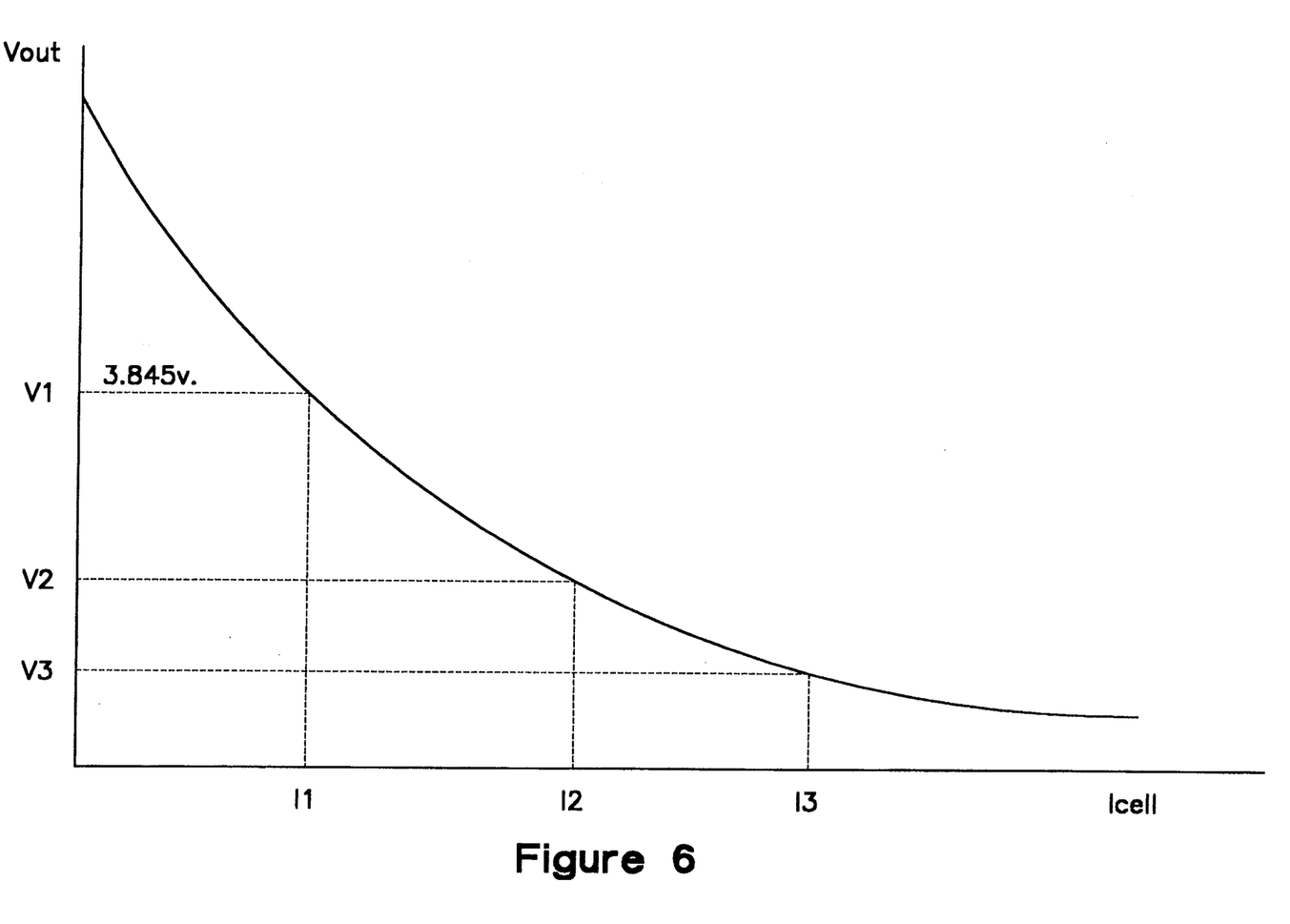
FIG. 6 is a diagram illustrating the voltage current characteristics of an element of the circuit of FIG. 4.

In order to assure that correct values are provided at the SIN terminal for each individual reference transistor 29, the voltage-current characteristics of the devices 27 are carefully evaluated at the current levels at which the devices 22 may be read. Thus, as is shown in FIG. 6, for different values of currents through the devices 22, different values of voltage are dropped across the device 27. In contrast to the general levels typically applied during programming (e.g., 1, 1.2, 3.2 v.), these voltages may be very precisely determined. By selecting the voltages furnished at the SIN terminal of the sense amplifier 28 from the pad 35 or from the digital-to-analog converter (or from similar sources of controlled voltage) to match the desired ones of these voltage values, the charges stored on each of the devices 29 may be very precisely adjusted.

Thus, if it is desired to set a reference device 29 to a value such that it may be used to measure a current of $I_1$, then a voltage value of $V_1$ (e.g., 3.845 v.) is selected and applied to the SIN terminal through the switch 37. The device 29 is then programmed by the application of voltages at its terminals until the sense amplifier 28 switches state. This provides a precise point for charge stored on the reference device 29 which takes into account all of the elements in the circuit 40 particularly including the elements 30, 31, and 32. Thus, knowing the exact value of current to be produced by the devices 22 is a particular state allows the precise value of the voltage to be dropped across the device 27 to be determined and applied to the SIN terminal and measured against the value of the voltage at the RIN terminal caused by the current through the device 29. The charges to be placed on the other reference devices 29 in order to provide the desired number of reference values are determined in a similar manner. For example, voltages $V_2$ and $V_3$ may be determined and utilized to set the charge programmed on the floating gates of two other reference devices 29 in an array in which the memory cells each allow four possible states and thus are capable of storing two bits of information.

This allows a method to be used for programing the reference cells in which the characteristics of the devices in the reference path during operation of the circuit are considered. The method for programming a flash EEPROM reference device in a memory array to a reference condition against which memory devices of the array may be tested includes the steps of disabling the input signals to the sense amplifiers from load devices used to measure the conditions of the memory devices of the array, and then furnishing the precise voltage levels selected to match voltage levels from the load devices in a selected state of the memory devices to the sense amplifiers in place of the disabled input signals from the load devices. Programming signals are then applied to program the reference device to a condition at which an input to the sense amplifiers from the reference device is just greater than the precise voltage furnished to the sense amplifier in place of the load voltage. When the sense amplifier switches output, the reference device is precisely programmed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit comprising:
a plurality of memory devices arranged in at least one column for storing a plurality of memory states;
at least one first load device arranged in each column and having a particular voltage-current characteristic for generating a read voltage during a read operation to a memory device in a corresponding column;
at least one reference device for storing a reference level corresponding to a reference current to determine a state stored in a selected memory device;
at least one second load device coupled in series to each reference device to generate a reference voltage based on said reference current; and
a programming circuit for generating a comparison voltage substantially equal to a voltage derived from said voltage-current characteristic of said first load device at said reference current, and for programming said reference device until said reference voltage at said second load device equals said comparison voltage, wherein said programming circuit accounts for variations in said first load device when programming said reference device.

2. The circuit as set forth in claim 1, further comprising:
a sense amplifier comprising a first terminal to receive said read voltage from said first load device and a second terminal to receive said reference voltage from said second load device;

a first switch coupling said read voltage to said first terminal;

a second switch coupling said programming circuit to said first terminal; and a controller coupled to said first and second switches to disable said read voltage and to couple said programming circuit to said first terminal during programming of said reference device.

3. The circuit as set forth in claim 1, wherein said programming circuit comprises a test circuit external to said memory devices.

4. The circuit as set forth in claim 1, wherein said programming circuit comprises a digital-to-analog converter (DAC) for generating said comparison voltage.

5. The circuit as set forth in claim 1, wherein said memory devices and said reference devices comprise flash electrically eraseable programmable read only memory (EEPROM) floating gate field effect transistors.

6. The circuit as set forth in claim 1, wherein said first and second load devices comprise field effect transistor devices that include a low threshold level.

7. The circuit as set forth in claim 1, wherein said first and second load devices comprise field effect transistor devices that include a low threshold level.

8. The circuit as set forth in claim 1, wherein said memory devices and Said reference devices comprise flash electrically eraseable programmable read only memory (EEPROM) floating gate field effect transistors capable of storing charge on a floating gate at four individual states.

9. A computer system comprising:
a central processing unit (CPU);
a bus coupled to said CPU;
a memory array coupled to said bus, said memory array comprising:
   a plurality of memory devices arranged in at least one column for storing a plurality of memory states;
   at least one first load device arranged in each column and having a particular voltage-current characteristic for generating a read voltage during a read operation to a memory device in a corresponding column;
   at least one reference device for storing a reference level corresponding to a reference current to determine a state stored in a selected memory device;
   at least one second load device coupled in series to each reference device to generate a reference voltage based on said reference current; and
a programming circuit for generating a comparison voltage substantially equal to a voltage derived from said voltage-current characteristic of said first load device at said reference current, and for programming said reference device until said reference voltage at said second load device equals said comparison voltage, wherein said programming circuit accounts for variations in said first load device when programming said reference device.

10. The computer system as set forth in claim 9, wherein said memory array further comprises:
a sense amplifier comprising a first terminal to receive said read voltage from said first load device and a second terminal to receive said reference voltage from said second load device;

a first switch coupling said read voltage to said first terminal;

a second switch coupling said programming circuit to said first terminal; and a controller coupled to said first and second switches to disable said read voltage and to couple said programming circuit to said first terminal during programming of said reference device.

11. The computer system as set forth in claim 9, wherein said programming circuit comprises a test circuit external to said computer system.

12. The computer system as set forth in claim 9, wherein said programming circuit comprises a digital-to-analog converter (DAC) for generating said comparison voltage.

13. The computer system as set forth in claim 9, wherein said memory devices and said reference devices comprise flash electrically eraseable programmable read only memory (EEPROM) floating gate field effect transistors.

14. The computer system as set forth in claim 9, wherein said first and second load devices comprise field effect transistor devices that include a low threshold level.

15. The computer system as set forth in claim 9, wherein said first and second load devices comprise field effect transistor devices that include a low threshold level.

16. The computer system as set forth in claim 9, wherein said memory devices and said reference devices comprise flash electrically eraseable programmable read only memory (EEPROM) floating gate field effect transistors capable of storing charge on a floating gate at four individual states.

17. A method for programming at least one reference device to a reference level in a memory array including a plurality of memory devices arranged in at least one column and a first load device having a particular voltage-current characteristic coupled to each column of memory devices, said reference device being coupled in series with a second load device to generate a reference voltage based on a reference current generated from said reference device, said method comprising the steps of:

generating a comparison voltage substantially equal to a voltage derived from said voltage-current characteristic of said first load device at said reference current; and programming said reference device until said reference voltage at said second load device equals said comparison voltage to account for variations in said first load device when programming said reference device.

18. The method as set forth in claim 17, further comprising the steps of:
receiving, at a first terminal of a sense amplifier, a read voltage from said first load device
receiving, at a second terminal of said sense amplifier, a reference voltage from said second load device;
selectively coupling said read voltage to said first terminal;
selectively coupling said first terminal to an external pad;
disconnecting said read voltage from said first terminal during programming of said reference device; and coupling said first terminal to said external pad to supply said comparison voltage to said first terminal during programming of said reference device.

19. A method for programming a flash EEPROM reference device in a memory array to a reference condition against which memory devices of the array may be tested comprising the steps of:

disabling input signals to sense amplifiers from load devices used to measure conditions of memory devices of the array, furnishing precise voltage levels to sense amplifiers in place of the disabled input signals from load devices, the precise voltage levels being selected to match voltage levels from load devices in a selected state of memory devices, and applying signals to program the reference device to a condition at which an input to the sense amplifiers from the reference device is just greater than a precise voltage furnished to the sense amplifier.

* * * * *